United States Patent [19]

Elarde

[11] 4,424,408

[45] Jan. 3, 1984

[54] HIGH TEMPERATURE CIRCUIT BOARD

[76] Inventor: Vito D. Elarde, 6429 Lance Ct., San Diego, Calif. 92120

[21] Appl. No.: 299,345

[22] Filed: Sep. 4, 1981

Related U.S. Application Data

[63] Continuation of Ser. No. 96,402, Nov. 21, 1979, abandoned, which is a continuation of Ser. No. 873,738, Jan. 30, 1978, abandoned, which is a continuation of Ser. No. 625,466, Oct. 24, 1975, abandoned.

[51] Int. Cl.³ .......................... H05K 1/09; H05K 3/14
[52] U.S. Cl. .............................. 174/68.5; 174/110 N; 174/117 PC; 427/423
[58] Field of Search .............. 174/68.5, 110 N, 117 F, 174/117 FF

[56] References Cited

U.S. PATENT DOCUMENTS

| | | | |
|---|---|---|---|
| 2,861,911 | 11/1958 | Martin | 174/68.5 |
| 2,876,530 | 3/1959 | Howatt | 427/423 X |
| 3,023,390 | 2/1962 | Moratis | 427/423 X |
| 3,666,617 | 5/1972 | Marciniak | 174/68.5 X |
| 3,680,209 | 8/1972 | Hacke | 174/68.5 |
| 3,781,596 | 12/1973 | Galli | 174/68.5 X |
| 3,811,934 | 5/1974 | Glaser | 427/423 X |
| 3,891,901 | 6/1975 | Booe | 317/258 |

OTHER PUBLICATIONS

Multi–Layer P–C Boards are Both Rigid and Flexible in all the Right Places, Electronics, Feb. 16, 1970, p. 116–121.

Du Pont Kapton Polyamide Film, Bull. H–1a.

*Primary Examiner*—R. R. Kucia
*Attorney, Agent, or Firm*—Brown & Martin

[57] ABSTRACT

A high temperature circuit board made by flame spraying a high temperature resistant metal film, such as aluminum, zinc or silver solder braze alloy, onto a high temperature resistant insulative substrate in which in one embodiment a reverse circuit image resist is layed on the board surface and the metal is flame sprayed onto the board surface and the reverse image resist screen is then removed leaving the circuit without etching. In the other embodiment aluminum is flame sprayed onto the substrate and then a silver solder braze alloy or copper or nickel is flame sprayed onto the aluminum film, and then resist and etching stops are applied to remove unwanted metal to the substrate and the resist is stripped providing the high temperature printed circuit board.

2 Claims, 13 Drawing Figures

FLAME SPRAY

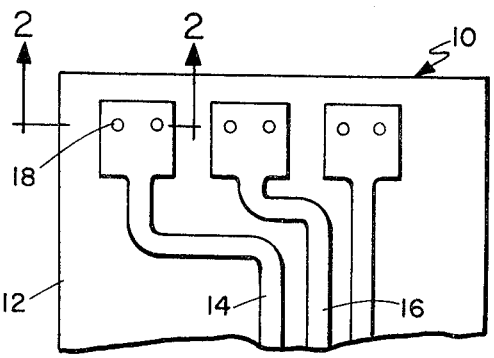
Fig. 1
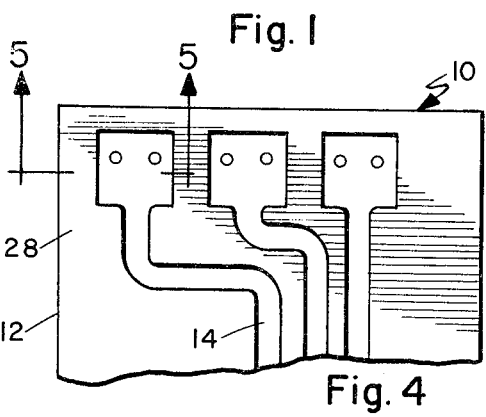
Fig. 4
APPLY REVERSE RESIST PATTERN
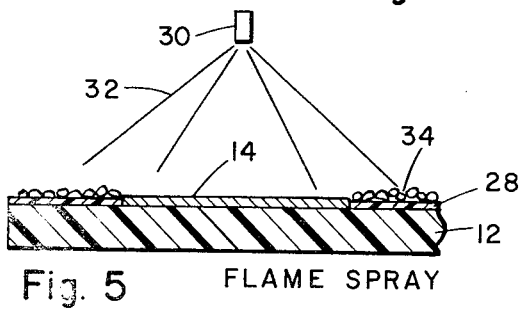
Fig. 5 FLAME SPRAY
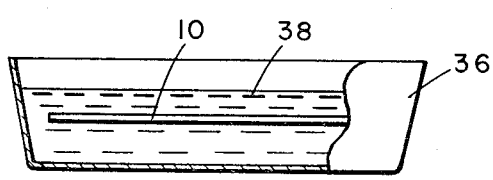
Fig. 6 REMOVE RESIST
Fig. 7
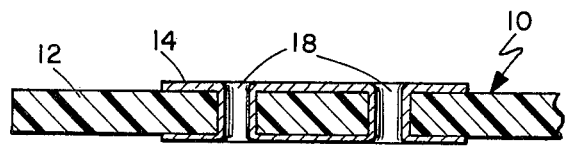
Fig. 2
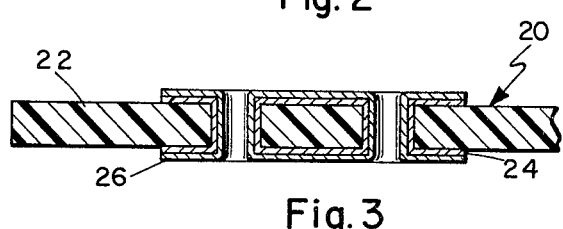
Fig. 3
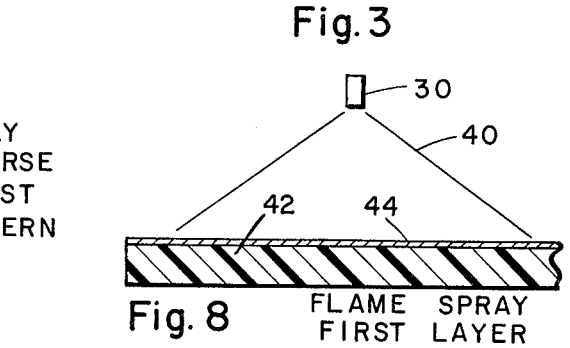
Fig. 8 FLAME SPRAY FIRST LAYER
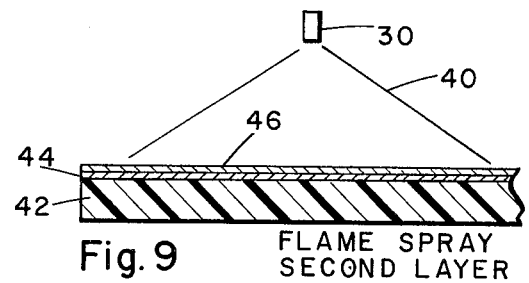
Fig. 9 FLAME SPRAY SECOND LAYER
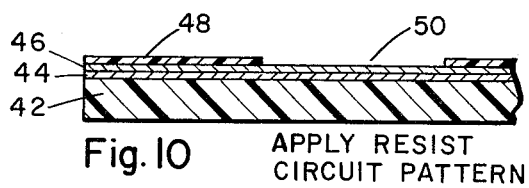
Fig. 10 APPLY RESIST CIRCUIT PATTERN
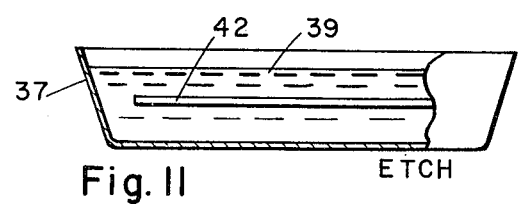
Fig. 11 ETCH
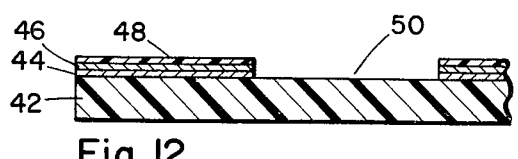
Fig. 12
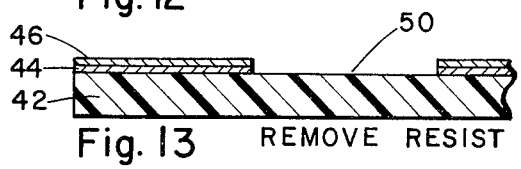
Fig. 13 REMOVE RESIST

HIGH TEMPERATURE CIRCUIT BOARD

REFERENCE TO RELATED APPLICATIONS

This application is a continuation of application Ser. No. 096,402 filed Nov. 21, 1979 and now abandoned, which was a continuation of application Ser. No. 873,738 filed Jan. 30, 1978 and now abandoned, which was a continuation of application Ser. No. 625,466 filed Oct. 24, 1975 and now abandoned.

BACKGROUND OF THE INVENTION

The need for high temperature printed citrcuit boards is well known, since the circuit board assembly becomes a permanent carrier for semi-conductor and other electrical components that are capable of operating under high temperatures. However while many types of high temperature boards have been used, such as nickel clad polyimides and nickel plated ceramic printed circuit boards, these boards have presented inherent problems. Some of the problems are poor solderability, poor adherence of the metallization to the substrate, cracking metallization, substrate degradation and high conductor resistance. Further many such circuit boards are difficult to make, are expensive, and oftentimes require use of exotic or expensive materials and processes.

So it is advantageous to have a high temperature performance circuit board that is capable of operating in high temperature environments in an effective manner, and that is easy to make and is relatively inexpensive.

SUMMARY OF THE INVENTION

The preferred embodiments of the method of making high temperature performance circuit boards generally comprise flame spraying a high temperature resistant metal in the form of a circuit onto the surface of a high temperature resistant and insulative substrate that may, for example, be a polyimide, modified polyimide or epoxy glass bonded laminate.

In one embodiment of the process, the substrate or board is predrilled with the required holes. The board is then cleaned and a reversed image resist is placed on the boards surface by the known processes. The board surface is then metallized by flame spraying a suitable metal such as aluminum, zinc or silver solder braze alloys that will be defined in more detail hereinafter. The flame spray metal adheres to the surface of the substrate on which there is no resist, but does not adhere to the resist surface. After the flame spray operation is complete including spraying through the holes, the resist is then removed by stripping or other suitable means, leaving the metallized circuit thereon.

In another embodiment, the insulated surface is cleaned and then metallized by flame spraying a thin film of aluminum thereon. A second metal film layer is then flame sprayed onto the aluminum layer, which second metal may be any of several metals such as nickel, copper, zinc, various silver solder braze alloys and other metals that will be more specifically defined hereinafter. Further nickel and copper may be electroplated or electroless plated onto the aluminum layer. A resist is then applied to the surface of the second metal layer in any known manner providing the desired circuit pattern, and the unwanted metal is etched and the resist stripped leaving the circuit pattern on the insulated substrate providing the printed circuit board.

This provides a high temperature metal that is adhered to the high temperature substrate providing the high temperature performance printed circuit board. However it should be recognized that the flame spraying process of this invention can also be used to lay printed circuits on low temperature boards, such as boards made of phenolics or thermo-plastics, to make very inexpensive printed circuit boards.

In the one embodiment, only a single spraying step is required to adhere the high temperature metal circuit onto the substrate. Aluminum provides an excellant bond when flame sprayed to the substrate as does flame sprayed silver solder braze alloy and zinc. This embodiment has the advantage of not requiring an etching step, but rather only a direct laying of the circuit onto the board that merely requires removal of the resist to provide a board that may be cut to size. No masking of the flame spraying is required other than laying the reverse image resist onto the board surface.

In the second embodiment, aluminum has been found to provide an excellant initial flame spray bond to the substrate and offers an excellant bondable surface for the subsequent silver solder braze alloys and other metals. It also provides a barrier to the solder thus retaining an excellant bond to the substrate. Also the initial flame spray aluminum coating is slightly porous in nature. Thus when the etching is done in standard ferre-chloride etchants, the aluminum is readily etched. So while silver braze is porous and hard to etch in the standard ferre-chloride etchants, the combination with aluminum allows an efficient etching of both the aluminum and the silver braze. Also while the substrate may be a ceramic, it is often advantageous to use a less expensive, high temperature plastic such as polyimides and epoxies. The aluminum/silver solder braze alloy combination can maintain the bond even through temperatures as high as 500 degrees C., if the substrate can withstand this temperature. Even in the case of plastic substrates, the slight porosity of the aforesaid metallization allows decomposing volitiles of the plastic when heated to high temperatures to pass through the metallization without causing blisters or bond failures. Other advantages of this metallization is that it provides a very good conductivity, and extremely low ohmic conductance as a current carrying member and at the same time low ohmic contact resistance in the contact fingers used to engage the printed circuit edge connector. Further the excellant oxidation resistance of this metallization eliminates the need for secondary plating for both storage and soldering consideration as well as low ohmic contact resistance.

Thus it is an object of this invention to provide a new and improved method of making a high temperature performing circuit board.

It is another object of this invention to provide a new and improved high temperature performing circuit board.

Other objects and many advantages of this invention will become more apparent upon a reading of the following detailed description and an examination of the drawings, wherein like reference numerals designate like parts throughout and in which.

FIG. 1 is a top plan view of an embodiment of a printed circuit board with the circuit layed thereon.

FIG. 2 is a sectional view taken on line 2—2 of FIG. 1, illustrating the single conductor metallization of the circuit board.

FIG. 3 is a sectional view similar to the sectional view of FIG. 2 of another embodiment of the method and circuit board of this invention, that has two flame sprayed layers of metallization.

FIG. 4 is a top plan view of an embodiment of the invention illustrating the applied reverse resist pattern on the insulated substrate.

FIG. 5 is a sectional view of the portion of the substrate with the pattern resist thereon, on which metal is being flame sprayed.

FIG. 6 illustrates the removal of the resist from the printed circuit board.

FIG. 7 is a sectional view of the end product from the first process of the invention.

FIG. 8 illustrates laying the first aluminum layer on the insulated substrate under the second embodiment of the process.

FIG. 9 diagrammatically illustrates the laying of the second layer onto the PC board.

FIG. 10 illustrates the laying of the resist onto the second layer.

FIG. 11 illustrates the step of etching the non-resist areas of the printed circuit boards.

FIG. 12 illustrates a sectional view of the circuit board with the metal removed by etching.

FIG. 13 illustrates the end product of the second embodiment of the process with the resist removed.

Referring now to the drawing, a printed circuit board 10 illustrates a board made in the first embodiment of the method of this invention. In this embodiment, an insulated substrate that may be of a ceramic material, or polyimide, modified polyimide or epoxy glass bonded laminate 12, has a printed circuit 14 or 16 flame sprayed thereon. The flame sprayed metal may comprise aluminum, zinc, silver braze or a suitable silver solder braze alloy such as percentage combinations of alloys as follows.

| Silver | 20 | 25 | 30 | 40 | 45 |
| Copper | 45 | 52.5 | 38 | 36 | 30 |
| Zinc | 35 | 22.5 | 32 | 24 | 25 |

In the process of making the printed circuit board of FIGS. 1 and 2, and referring to FIGS. 4 through 7, all holes are pre-drilled and the board is then cleaned. A reverse image resist 28 is then layed onto the surface substrate 12 in any suitable manner such as by standard silk screening techniques or use of photo-resist techniques. After this reverse image (FIG. 4) has been applied, the aforesaid suitable metals are then flame sprayed from a source 30 in a spray 32 across the surface of the board 12 as illustrated in FIG. 5. The layer of sprayed material securely attaches and affixes to the surface of the insulated substrate forming layer 14 but the material at 34 will not adhere to the resist surface 12. While any suitable thickness of the applied metallizing may be used, the desired thickness is generally between 0.001 inch to about 0.006 inch thick. After flame spraying, including spraying through the holes, the resist is removed, such as by dipping in a bath 38 in a tank 36, leaving the metallized flame sprayed high temperature metal surface 14 on the substrate 12, as seen in FIG. 7 and in the holes as shown at 18 in FIG. 2. Thus a single circuit conductor 14 with no layers of metal is easily and directly flame sprayed onto the high temperature insulative surface 12 providing the circuit pattern of FIGS. 1 and 2 without requiring etching to remove unwanted portions of the metal. This provides a simple and inexpensive high temperature printed circuit board.

In experiments, circuit boards have been made with all of the metals listed, and all of the boards that were made operated successfully in the improved manner expected. However in this experimentation, it was determined that the following metals would not adhere to the substrate when directly flame sprayed: Copper, nickel, tin, bronze, brass, monel, chrome and chrome oxide.

The second process illustrated in FIGS. 8 through 13 provides the board illustrated in FIG. 3. In this process, the holes are pre-drilled and the board is cleaned, such as by degreasing or lightly sand-blasting to develop a slightly rough surface. The dust is then removed. The board surface is then metallized by flame spraying a spray 40 of aluminum forming a thin layer 44 of aluminum (FIG. 8). This aluminum layer 44 may have a thickness of 0.005 inch to 0.001 inch. The flame spraying process may be any known flame spraying process as for example, by a wire feed. Also a powder feed type can be incorporated to produce a finer or smoother coating. A second metallized layer 46 is then applied over the first layer (FIG. 9). This second layer may comprise a silver solder braze alloy as follows.

| Silver | 20 | 25 | 30 | 40 | 45 |
| Copper | 45 | 52.5 | 38 | 36 | 30 |
| Zinc | 35 | 22.5 | 32 | 24 | 25 | and may also include the range of alloys as set forth hereinafter,

| Silver | 5 | 15 | 5 | 7 | 9 | — | — | — | — |
| Copper | 89 | 80 | 58 | 85 | 53 | 60 | 100 | 50 | — |
| Zinc | — | — | 37 | — | 38 | 40 | — | 40 | — |
| Phosphorous | 6 | 5 | — | — | — | — | — | — | — |
| Tin | — | — | — | 8 | — | — | — | — | — |
| Nickel | — | — | — | — | — | — | — | 10 | 100 |

The second layer 46 may also include nickel electroplated, nickel electroless plated, copper electroplated and copper electroless plated. The second layer normally has a thickness of about 0.001 inch to about 0.006 inch. In experiments, printed circuit boards have been made with all of the metals listed and all of the boards and circuits performed successfully.

A resist 48 is now applied to the surface by standard techniques such as by photo-film exposing and developing (FIG. 10). The board 42 is then placed in an etchant bath 30 such as a standard ferre-chloride etchant in a tank 37 (FIG. 11), which etches the outer metal layer 46 and the aluminum layer 44 to remove the unwanted metal at 50 providing the circuit configuration, as seen in FIG. 12. The resist is then stripped from the surface of layer 46 (FIG. 13), and the board is cut to size.

It should be understood that the processes disclosed can be and are used to provide double sided boards, such as is illustrated in FIGS. 2 and 3. Each side of the board can be flame sprayed separately or simultaneously. Flame spraying has the particular advantage of plating through the holes.

Having described my invention, I now claim:
1. A high temperature performance circuit board comprising:
   an insulating board of high temperature resistant material, said high temperature resistant material selected from the group consisting of polyimide, modified polyimide and epoxy glass bonded laminate, and a metal circuit of conductive metal flame sprayed on said board, said metal circuit comprising a first layer of aluminum, and a second metal layer selected from the group consisting of nickel, copper, silver solder brazed alloy comprising about 20% to 45% silver and 30% to 52.5% copper and 22.5% to 35% zinc, an alloy of about 5% to 15% silver and 80% to 89% copper and 5% to 6% phosphorous, an alloy of about 5% to 9% silver and 53% to 58% copper and 37% to 38% zinc, an alloy of about 7% silver and 85% copper and 8% tin, an alloy of about 60% copper and 40% zinc, and an alloy of about 50% copper and 40% zinc and 10% nickel.

2. A circuit board comprising:

an insulating board of heat resistant material, and a metal circuit flame sprayed on said board, said metal circuit comprising a first thin layer of a bond enhancing material and a second layer consisting of a metal selected from the group consisting of nickel, copper, silver solder brazed alloy comprising about 20% to 45% silver and 30% to 52.5% copper and 22.5% to 35% zinc, an alloy of about 5% to 15% silver and 80% to 89% copper and 5% to 6% phosphorous, an alloy of about 5% to 9% silver and 53% to 58% copper and 37% to 38% zinc, an alloy of about 7% silver and 85% copper and 8% tin, an alloy of about 60% copper and 40% zinc, and an alloy of about 50% copper and 40% zinc and 10% nickel.

* * * * *